US009246022B2

(12) United States Patent
Zhang et al.

(10) Patent No.: US 9,246,022 B2
(45) Date of Patent: Jan. 26, 2016

(54) VARACTORS INCLUDING INTERCONNECT LAYERS

(71) Applicant: BLACKBERRY LIMITED, Waterloo (CA)

(72) Inventors: Xubai Zhang, Nashua, NH (US); Louise C. Sengupta, Ellicott City, MD (US); Jason Sun, Columbia, MD (US); Nicolaas Du Toit, Columbia, MD (US)

(73) Assignee: BlackBerry Limited, Waterloo, ON (CA)

( * ) Notice: Subject to any disclaimer, the term of this patent is extended or adjusted under 35 U.S.C. 154(b) by 1 day.

(21) Appl. No.: 13/963,221

(22) Filed: Aug. 9, 2013

(65) Prior Publication Data

US 2013/0320501 A1 Dec. 5, 2013

Related U.S. Application Data

(60) Continuation of application No. 12/313,491, filed on Nov. 20, 2008, now Pat. No. 8,530,948, which is a division of application No. 10/952,964, filed on Sep. 29, 2004, now abandoned.

(51) Int. Cl.
*H01L 29/93* (2006.01)
*H01L 27/08* (2006.01)

(52) U.S. Cl.
CPC ............ *H01L 29/93* (2013.01); *H01L 27/0808* (2013.01)

(58) Field of Classification Search
None
See application file for complete search history.

(56) References Cited

U.S. PATENT DOCUMENTS

| | | | |
|---|---|---|---|
| 5,307,304 A * | 4/1994 | Saito et al. ..................... 365/145 |
| 5,312,790 A | 5/1994 | Sengupta | |
| 5,427,988 A | 6/1995 | Sengupta | |
| 5,439,849 A * | 8/1995 | McBride et al. .............. 438/763 |
| 5,486,491 A | 1/1996 | Sengupta | |
| 5,576,564 A | 11/1996 | Satoh | |
| 5,593,495 A | 1/1997 | Masuda | |
| 5,612,560 A * | 3/1997 | Chivukula et al. ............ 257/309 |
| 5,635,433 A | 6/1997 | Sengupta | |
| 5,635,434 A | 6/1997 | Sengupta | |
| 5,640,042 A | 6/1997 | Koscica | |
| 5,693,429 A | 12/1997 | Sengupta | |
| 5,694,134 A | 12/1997 | Barnes | |
| 5,721,194 A | 2/1998 | Yandrofski | |
| 5,766,697 A | 6/1998 | Sengupta | |
| 5,830,591 A | 11/1998 | Sengupta | |
| 5,846,893 A | 12/1998 | Sengupta | |
| 5,864,932 A * | 2/1999 | Evans et al. .................. 29/25.42 |
| 5,886,867 A | 3/1999 | Chivukula | |
| 5,990,766 A | 11/1999 | Zhang | |
| 6,074,971 A | 6/2000 | Chiu | |
| 6,242,989 B1 | 6/2001 | Barber | |
| 6,377,142 B1 | 4/2002 | Chiu | |
| 6,377,217 B1 | 4/2002 | Zhu | |
| 6,377,440 B1 | 4/2002 | Zhu | |
| 6,404,614 B1 | 6/2002 | Zhu | |

(Continued)

*Primary Examiner* — Bilkis Jahan
*Assistant Examiner* — Kevin Quinto
(74) *Attorney, Agent, or Firm* — Guntin & Gust, PLC; Andrew Gust

(57) ABSTRACT

In an embodiment of the present invention is provided a varactor comprising a substrate, a plurality of bottom electrodes positioned on a surface of the substrate separated to form a gap therein, a tunable dielectric material positioned on the surface of the substrate and within the gap, the tunable dielectric at least partially overlaying the plurality of electrodes, and a top electrode in contact with the tunable dielectric.

9 Claims, 11 Drawing Sheets

(56) References Cited

U.S. PATENT DOCUMENTS

| | | | |
|---|---|---|---|
| 6,492,883 B2 | 12/2002 | Liang | |
| 6,514,895 B1 | 2/2003 | Chiu | |
| 6,525,630 B1 | 2/2003 | Zhu | |
| 6,531,936 B1 | 3/2003 | Chiu | |
| 6,535,076 B2 | 3/2003 | Partridge | |
| 6,538,603 B1 | 3/2003 | Chen | |
| 6,556,102 B1 | 4/2003 | Sengupta | |
| 6,590,468 B2 | 7/2003 | du Toit | |
| 6,597,265 B2 | 7/2003 | Liang | |
| 6,617,062 B2 | 9/2003 | Chang | |
| 6,683,341 B1 | 1/2004 | York | |
| 6,737,179 B2 | 5/2004 | Sengupta | |
| 6,774,077 B2 | 8/2004 | Sengupta | |
| 2001/0022363 A1* | 9/2001 | Nagata et al. | 257/59 |
| 2001/0022372 A1* | 9/2001 | Kanaya et al. | 257/295 |
| 2002/0034667 A1 | 3/2002 | Sengupta | |
| 2002/0051334 A1* | 5/2002 | Zhu et al. | 361/277 |
| 2002/0123158 A1* | 9/2002 | Murai | 438/3 |
| 2003/0071300 A1 | 4/2003 | Yashima | |
| 2003/0183920 A1 | 10/2003 | Goodrich | |
| 2003/0216017 A1 | 11/2003 | Drab | |
| 2004/0130849 A1* | 7/2004 | Kurihara et al. | 361/311 |
| 2004/0150939 A1 | 8/2004 | Huff | |
| 2004/0173876 A1 | 9/2004 | Musalem | |
| 2004/0259316 A1 | 12/2004 | Acikel et al. | |
| 2005/0006643 A1 | 1/2005 | Lan et al. | |
| 2005/0130608 A1 | 6/2005 | Forse | |

\* cited by examiner

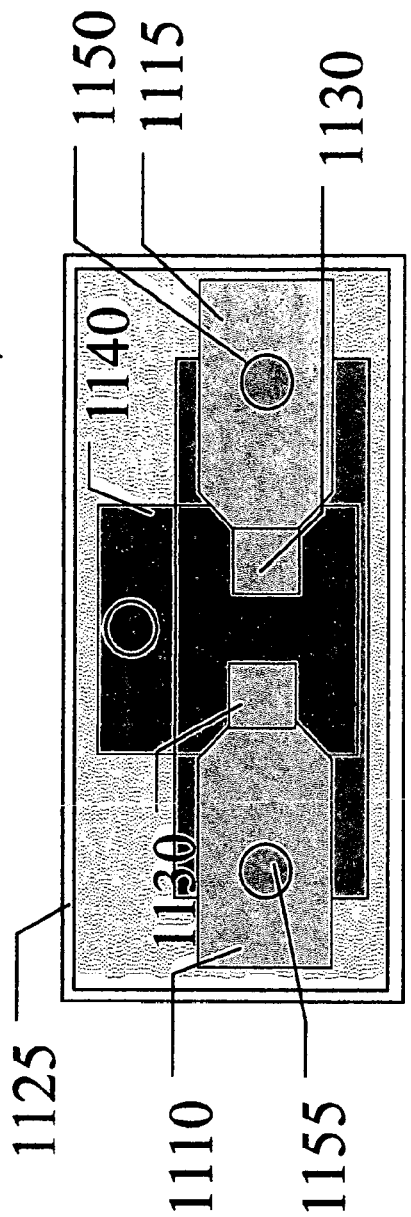
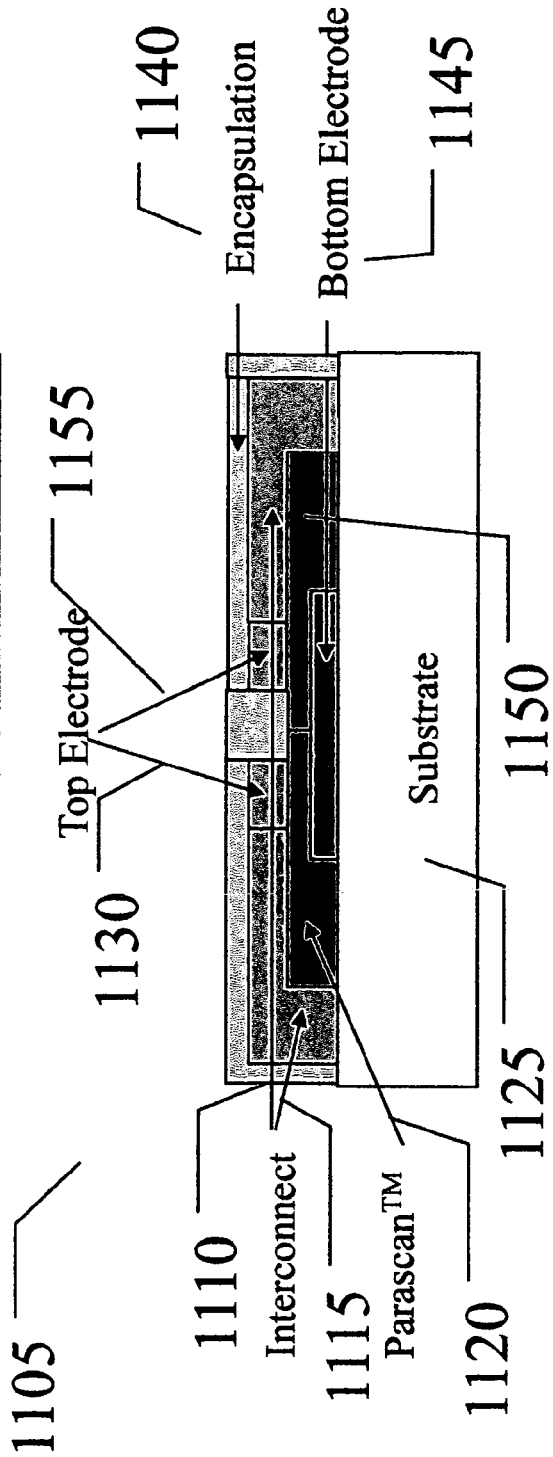
FIG. 11

VARACTORS INCLUDING INTERCONNECT LAYERS

CROSS-REFERENCE TO RELATED APPLICATIONS

This application is a continuation of and claims priority to U.S. patent application Ser. No. 12/313,491 filed Nov. 20, 2008, which is a divisional of U.S. patent application Ser. No. 10/952,964, filed Sep. 29, 2004, now abandoned, which are all incorporated herein by reference in their entirety.

FIELD OF THE DISCLOSURE

Varactors are voltage tunable capacitors in which the capacitance is dependent on a voltage applied thereto. Although not limited in this respect, this property has applications in electrically tuning radio frequency (RF) circuits, such as filters, phase shifters, and so on. The most commonly used varactor is semiconductor diode varactor, which has the advantages of high tunability and low tuning voltage, but suffers low Q, low power handling capability, and limited capacitance range. A new type of varactor is a ferroelectric varactor in which the capacitance is tuned by varying the dielectric constant of a ferroelectric material by changing the bias voltage. Ferroelectric varactors have high Q, high power handling capacity, and high capacitance range.

One ferroelectric varactor is disclosed in U.S. Pat. No. 5,640,042 entitled "Thin Film Ferroelectric Varactor" by Thomas E. Koscica et al. That patent discloses a planar ferroelectric varactor, which includes a carrier substrate layer, a high temperature superconducting metallic layer deposited on the substrate, a lattice matching, a thin film ferroelectric layer deposited on the metallic layer, and a plurality of metallic conductors disposed on the ferroelectric layer and in contact with radio frequency (RF) transmission lines in tuning devices. Another tunable capacitor using a ferroelectric element in combination with a superconducting element is disclosed in U.S. Pat. No. 5,721,194. Tunable varactors that utilizes a ferroelectric layer, and various devices that include such varactors are also disclosed in U.S. patent application Ser. No. 09/419,126, now U.S. Pat. No. 6,531,936, entitled "Voltage Tunable Varactors And Tunable Devices Including Such Varactors," filed Oct. 15, 1999, and assigned to the same assignee as the present invention.

Thus, there is strong need in the industry for an improved varactor and methods of use and manufacture therefore.

BACKGROUND

An embodiment of the present invention provides a varactor comprising a bottom electrode supported by a substrate; a tunable dielectric in contact with the bottom electrode and in contact with a top electrode; and an interconnect in contact with the top electrode and capable of being in contact with a voltage source. The top electrode and the tunable dielectric may be encapsulated and the tunable dielectric layer may comprise one of: barium strontium titanate, barium calcium titanate, lead zirconium titanate, lead lanthanum zirconium titanate, lead titanate, barium calcium zirconium titanate, sodium nitrate, $KNbO_3$, $LiNbO_3$, $LiTaO_3$, $PbNb_2O_6$, $PbTa_2O_6$, $KSr(NbO_3)$, $NaBa_2(NbO_3)_5$, $KH_2PO_4$, and composites thereof. Further, the substrate may comprise one of: MgO, alumina ($AL_2O_3$), $LaAlO_3$, glass, sapphire, quartz, silicon, gallium arsenide and any material classified as low temperature co-fired ceramic (LTCC) and the top or bottom electrode may comprise one of: gold, aluminum, copper, nickel, palladium, platinum, platinum-rhodium, and ruthenium oxide, indium tin oxide.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

FIG. 11 is a cross sectional and top view of a double varactor design of one embodiment of the present invention.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Figure 1:
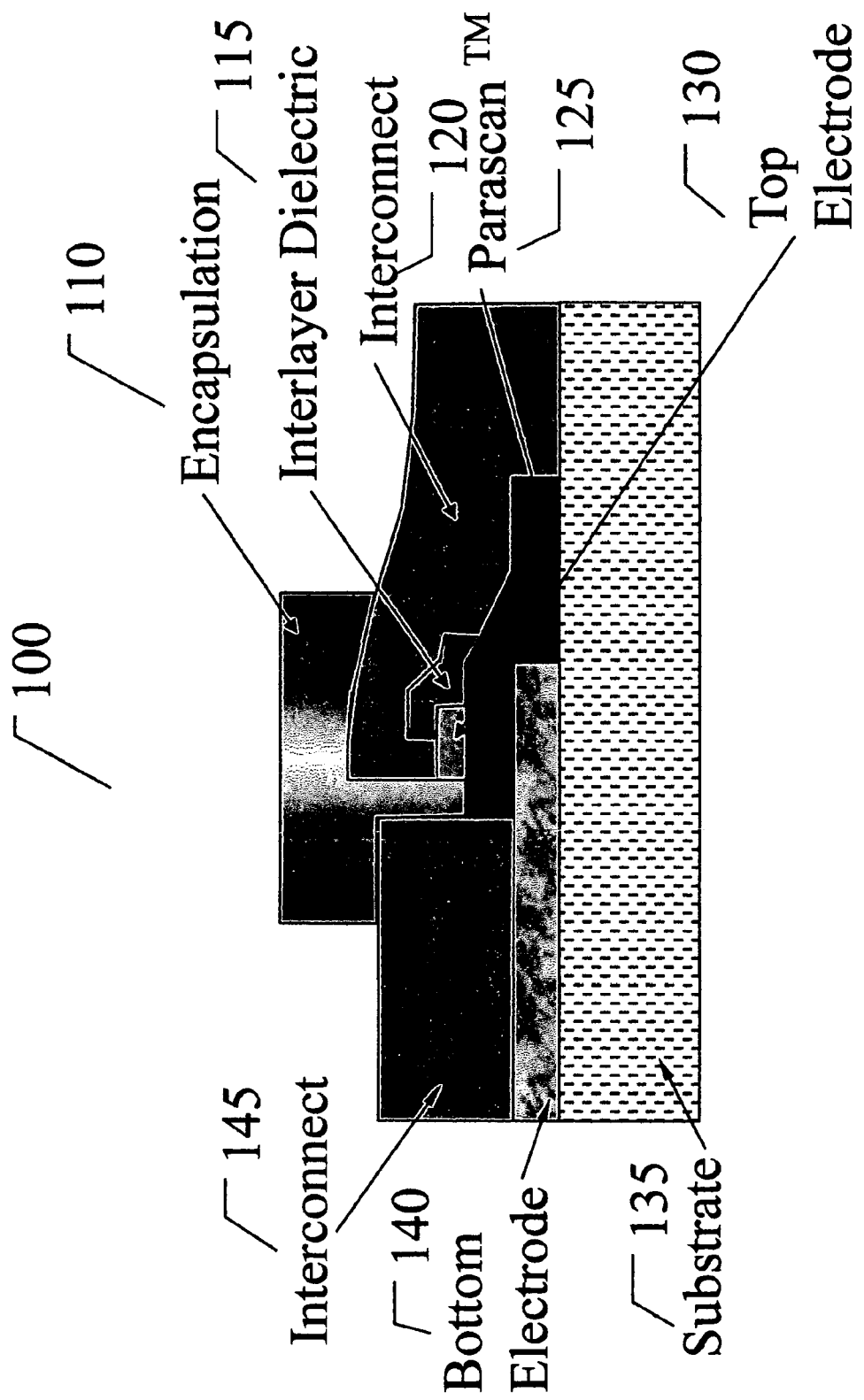
FIG. 1 depicts an embodiment of a vertical varactor of the present invention.

Turning now to FIG. 1, shown generally as 100, is a varactor comprising: a substrate 135, a bottom electrode 140 positioned on a surface of the substrate 135, a tunable dielectric material 125 positioned adjacent to and extending over the bottom electrode 140 forming a step and in contact with a top electrode 130, interconnect layers 145 and 120 may be in contact with the bottom electrode 140, the tunable dielectric 125 and the top electrode 130. Further, an interlayer dielectric 115 may be in contact with the tunable dielectric 125, the interconnect 120 and the top electrode 130. The interlayer dielectric 115 may be organic and photodefinable or inorganic that is patterned, milled or etched. Although the present invention is not limited to these types of interlayer dielectrics nor this fabrication process. The tunable dielectric 125 may be, but is not required to be, Parascan™ tunable dielectric. The term Parascan™ as used herein is a trademarked term indicating a tunable dielectric material developed by the assignee of the present invention. Parascan™ tunable dielectric materials have been described in several patents. Barium strontium titanate (BaTiO3-SrTiO3), also referred to as BSTO, is used for its high dielectric constant (200-6,000) and large change in dielectric constant with applied voltage (25-75 percent with a field of 2 Volts/micron). Tunable dielectric materials including barium strontium titanate are disclosed in U.S. Pat. No. 5,312,790 to Sengupta, et al. entitled "Ceramic Ferroelectric Material"; U.S. Pat. No. 5,427,988 by Sengupta, et al. entitled "Ceramic Ferroelectric Composite Material—BSTO—MgO"; U.S. Pat. No. 5,486,491 to Sengupta, et al. entitled "Ceramic Ferroelectric Composite Material—BSTO—ZrO2"; U.S. Pat. No. 5,635,434 by Sengupta, et al. entitled "Ceramic Ferroelectric Composite Material-BSTO-Magnesium Based Compound"; U.S. Pat. No. 5,830,591 by Sengupta, et al. entitled "Multilayered Ferroelectric Composite Waveguides"; U.S. Pat. No. 5,846,893 by Sengupta, et al. entitled "Thin Film Ferroelectric Composites and Method of Making"; U.S. Pat. No. 5,766,697 by Sengupta, et al. entitled "Method of Making Thin Film Composites"; U.S. Pat. No. 5,693,429 by Sengupta, et al. entitled "Electronically Graded Multilayer Ferroelectric Composites"; U.S. Pat. No. 5,635,433 by Sengupta entitled "Ceramic Ferroelectric Composite Material BSTO—ZnO"; U.S. Pat. No. 6,074,971 by Chiu et al. entitled "Ceramic Ferroelectric Composite Materials with Enhanced Electronic Properties BSTO Mg Based Compound-Rare Earth Oxide". These patents are incorporated herein by reference. The materials shown in these patents, especially BSTO—MgO composites, show low dielectric loss and high tunability. Tunability is defined as the fractional change in the dielectric constant with applied voltage.

Barium strontium titanate of the formula BaxSr1-xTiO3 is a preferred electronically tunable dielectric material due to its favorable tuning characteristics, low Curie temperatures and low microwave loss properties. In the formula BaxSr1-xTiO3, x can be any value from 0 to 1, preferably from about 0.15 to about 0.6. More preferably, x is from 0.3 to 0.6.

Other electronically tunable dielectric materials may be used partially or entirely in place of barium strontium titanate. An example is BaxCa$_1$-xTiO3, where x is in a range from about 0.2 to about 0.8, preferably from about 0.4 to about 0.6. Additional electronically tunable ferroelectrics include PbxZr1-xTiO$_3$ (PZT) where x ranges from about 0.0 to about 1.0, PbxZr1-xSrTiO$_3$ where x ranges from about 0.05 to about 0.4, KTaxNb1-xO$_3$ where x ranges from about 0.0 to about 1.0, lead lanthanum zirconium titanate (PLZT), PbTiO$_3$, BaCaZrTiO$_3$, NaNO$_3$, KNbO$_3$, LiNbO$_3$, LiTaO$_3$, PbNb$_2$O$_6$, PbTa$_2$O$_6$, KSr(NbO$_3$) and NaBa2(NbO$_3$)5KH$_2$PO$_4$, and mixtures and compositions thereof. Also, these materials can be combined with low loss dielectric materials, such as magnesium oxide (MgO), aluminum oxide (Al$_2$O$_3$), and zirconium oxide (ZrO$_2$), and/or with additional doping elements, such as manganese (MN), iron (Fe), and tungsten (W), or with other alkali earth metal oxides (i.e. calcium oxide, etc.), transition metal oxides, silicates, niobates, tantalates, aluminates, zirconnates, and titanates to further reduce the dielectric loss.

In addition, the following U.S. Patent Applications, assigned to the assignee of this application, disclose additional examples of tunable dielectric materials: U.S. application Ser. No. 09/594,837 filed Jun. 15, 2000, entitled "Electronically Tunable Ceramic Materials Including Tunable Dielectric and Metal Silicate Phases"; U.S. application Ser. No. 09/68,690 filed Jan. 24, 2001, entitled "Electronically Tunable, Low-Loss Ceramic Materials Including a Tunable Dielectric Phase and Multiple Metal Oxide Phases"; U.S. application Ser. No. 09/882,605 filed Jun. 15, 2001, entitled "Electronically Tunable Dielectric Composite Thick Films And Methods Of Making Same"; U.S. application Ser. No. 09/834,327 filed Apr. 13, 2001, entitled "Strain-Relieved Tunable Dielectric Thin Films"; and U.S. Provisional Application Ser. No. 60/295,046 filed Jun. 1, 2001 entitled "Tunable Dielectric Compositions Including Low Loss Glass Frits". These patent applications are incorporated herein by reference.

The tunable dielectric materials can also be combined with one or more non-tunable dielectric materials. The non-tunable phase(s) may include MgO, MgAl$_2$O$_4$, MgTiO$_3$, Mg$_2$SiO$_4$, CaSiO$_3$, MgSrZrTiO$_6$, CaTiO$_3$, Al$_2$O$_3$, SiO$_2$ and/or other metal silicates such as BaSiO$_3$ and SrSiO$_3$. The non-tunable dielectric phases may be any combination of the above, e.g., MgO combined with MgTiO$_3$, MgO combined with MgSrZrTiO$_6$, MgO combined with Mg$_2$SiO$_4$, MgO combined with Mg$_2$SiO$_4$, Mg$_2$SiO$_4$ combined with CaTiO3 and the like.

Additional minor additives in amounts of from about 0.1 to about 5 weight percent can be added to the composites to additionally improve the electronic properties of the films. These minor additives include oxides such as zirconnates, tannates, rare earths, niobates and tantalates. For example, the minor additives may include CaZrO$_3$, BaZrO$_3$, SrZrO$_3$, BaSnO3, CaSnO$_3$, MgSrO3, Bi2O3/2SnO$_2$, Nd$_2$O$_3$, Pr$_7$O$_{11}$, Yb2O3, Ho2O3, La2O3, MgNb$_2$O$_6$, SrNb$_2$O$_6$, BaNb$_2$O$_6$, MgTa2O6, BaTa2O6 and Ta2O3.

Thick films of tunable dielectric composites may comprise Ba1-xSrxTiO3, where x is from 0.3 to 0.7 in combination with at least one non-tunable dielectric phase selected from MgO, MgTiO3, MgZrO3, MgSrZrTiO6, Mg2SiO4, CaSiO3, MgAl2O4, CaTiO3, Al2O3, SiO2, BaSiO3 and SrSiO3. These compositions can be BSTO and one of these components, or two or more of these components in quantities from 0.25 weight percent to 80 weight percent with BSTO weight ratios of 99.75 weight percent to 20 weight percent.

The electronically tunable materials may also include at least one metal silicate phase. The metal silicates may include metals from Group 2A of the Periodic Table, i.e., Be, Mg, Ca, Sr, Ba and Ra, preferably Mg, Ca, Sr and Ba. Preferred metal silicates include Mg2SiO4, CaSiO3, BaSiO3 and SrSiO3. In addition to Group 2A metals, the present metal silicates may include metals from Group 1A, i.e., Li, Na, K, Rb, Cs and Fr, preferably Li, Na and K. For example, such metal silicates may include sodium silicates such as Na2SiO3 and NaSiO3-5H2O, and lithium-containing silicates such as LiAlSiO4, Li2SiO3 and Li4SiO4. Metals from Groups 3A, 4A and some transition metals of the Periodic Table may also be suitable constituents of the metal silicate phase. Additional metal silicates may include Al2Si2O7, ZrSiO4, KalSi3O8, NaAlSi3O8, CaAl2Si2O8, CaMgSi2O6, BaTiSi3O9 and Zn2SiO4. The above tunable materials can be tuned at room temperature by controlling an electric field that is applied across the materials.

In addition to the electronically tunable dielectric phase, the electronically tunable materials can include at least two additional metal oxide phases. The additional metal oxides may include metals from Group 2A of the Periodic Table, i.e., Mg, Ca, Sr, Ba, Be and Ra, preferably Mg, Ca, Sr and Ba. The additional metal oxides may also include metals from Group 1A, i.e., Li, Na, K, Rb, Cs and Fr, preferably Li, Na and K. Metals from other Groups of the Periodic Table may also be suitable constituents of the metal oxide phases. For example, refractory metals such as Ti, V, Cr, Mn, Zr, Nb, Mo, Hf, Ta and W may be used. Furthermore, metals such as Al, Si, Sn, Pb and Bi may be used. In addition, the metal oxide phases may comprise rare earth metals such as Sc, Y, La, Ce, Pr, Nd and the like.

The additional metal oxides may include, for example, zirconnates, silicates, titanates, aluminates, stannates, niobates, tantalates and rare earth oxides. Preferred additional metal oxides include Mg2SiO4, MgO, CaTiO3, MgZrSrTiO6, MgTiO3, MgAl2O4, WO3, SnTiO4, ZrTiO4, CaSiO3, CaSnO3, CaWO4, CaZrO3, MgTa2O6, MgZrO3, MnO2, PbO, Bi2O3 and La2O3. Particularly preferred additional metal oxides include Mg2SiO4, MgO, CaTiO3, MgZrSrTiO6, MgTiO3, MgAl2O4, MgTa2O6 and MgZrO3.

The additional metal oxide phases are typically present in total amounts of from about 1 to about 80 weight percent of the material, preferably from about 3 to about 65 weight percent, and more preferably from about 5 to about 60 weight percent. In one preferred embodiment, the additional metal oxides comprise from about 10 to about 50 total weight percent of the material. The individual amount of each additional metal oxide may be adjusted to provide the desired properties. Where two additional metal oxides are used, their weight ratios may vary, for example, from about 1:100 to about 100:1, typically from about 1:10 to about 10:1 or from about 1:5 to about 5:1. Although metal oxides in total amounts of from 1 to 80 weight percent are typically used, smaller additive amounts of from 0.01 to 1 weight percent may be used for some applications.

The additional metal oxide phases can include at least two Mg-containing compounds. In addition to the multiple Mg-containing compounds, the material may optionally include Mg-free compounds, for example, oxides of metals selected from Si, Ca, Zr, Ti, Al and/or rare earths.

The varactor of one embodiment of the present invention may provide that any or all of the bottom electrode 140, the tunable dielectric 125, the top electrode 130, the interconnect 120, 145 or the interlayer dielectric 115 are encapsulated. As mentioned above, an interlayer dielectric 115 may be in contact with the top electrode 130, the tunable dielectric 125 and the interconnect 120, 145.

The tunable dielectric layer may comprises one of: barium strontium titanate, barium calcium titanate, lead zirconium titanate, lead lanthanum zirconium titanate, lead titanate, barium calcium zirconium titanate, sodium nitrate, $KNbO_3$, $LiNbO_3$, $LiTaO_3$, $PbNb_2O_6$, $PbTa_2O_6$, $KSr(NbO_3)$, $NaBa_2(NbO_3)_5$, $KH_2PO_4$, and composites thereof. Further, the tunable dielectric layer may comprises a barium strontium titanate (BSTO) composite selected from the group of: BSTO—MgO, BSTO—$MgAl_2O_4$, BSTO—$CaTiO_3$, BSTO—$MgTiO_3$, BSTO—$MgSrZrTiO_6$, and combinations thereof. Further, the substrate 135 may comprise one of: MgO, alumina ($AL_2O_3$), $LaAlO_3$, glass, sapphire, quartz, silicon, gallium arsenide and any material classified as low temperature co-fired ceramic (LTCC) and the top 130 or bottom 140 electrode may comprise one of: gold, aluminum, copper, nickel, palladium, platinum, platinum-rhodium, ruthenium oxide and indium tin oxide. The configuration of FIG. 1 improves on the prevention of a short and the use of a "step over" enables ease of fabrication.

In any or all embodiments of the present invention, and not limited in this respect, adhesion layers may be used between a bottom electrode and a substrate, and/or a bottom electrode and the tunable dielectric and/or the tunable dielectric and the interlayer dielectric and/or the tunable dielectric and a top electrode or interconnect and/or a top electrode and interconnect. Further, all electrodes may contain multi metallic layers.

Figure 2:
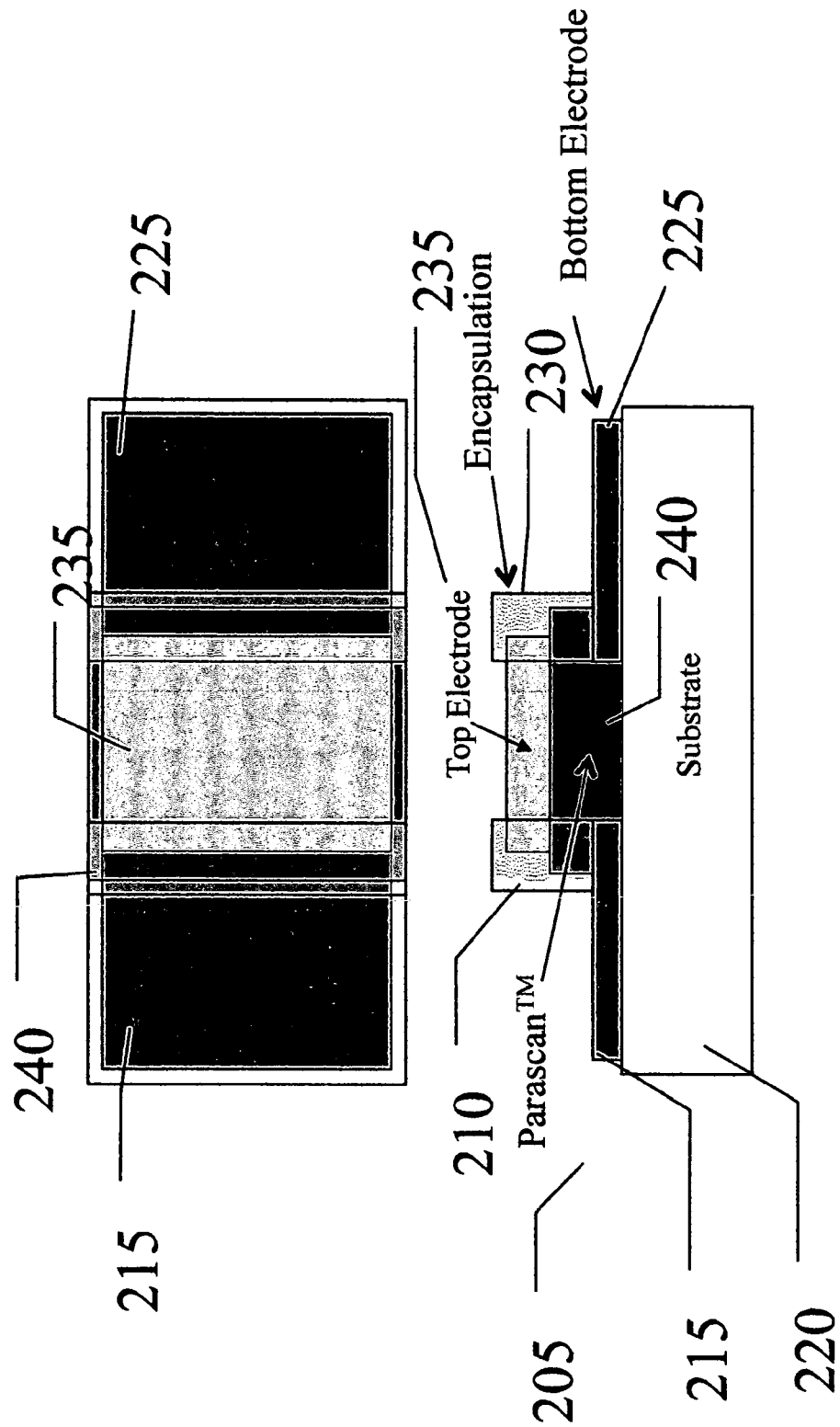
FIG. 2 illustrates, with a cross sectional and top view, a double varactor design of one embodiment of the present invention.

Turning now to FIG. 2, another embodiment of the present invention may provide at 200 a substrate 220, a plurality of bottom electrodes 215 and 225 positioned on a surface of the substrate 220 separated to form a gap therein. A tunable dielectric material 240 may be positioned on the surface of the substrate 220 and within the gap and the tunable dielectric 240 may be at least partially overlaying the plurality of electrodes 215 and 225. Further, a top electrode 235 may be in contact with the tunable dielectric 240.

The varactor of this embodiment may provide that the top electrode, the tunable dielectric and the bottom electrode are encapsulated; however, it is understood that the present invention is not limited in this respect. In an embodiment of the present invention, the top 235 or bottom 215 and 225 electrodes may comprise one of: gold, aluminum, copper, nickel, palladium, platinum, platinum-rhodium, and ruthenium oxide, indium tin oxide.

Figure 3:
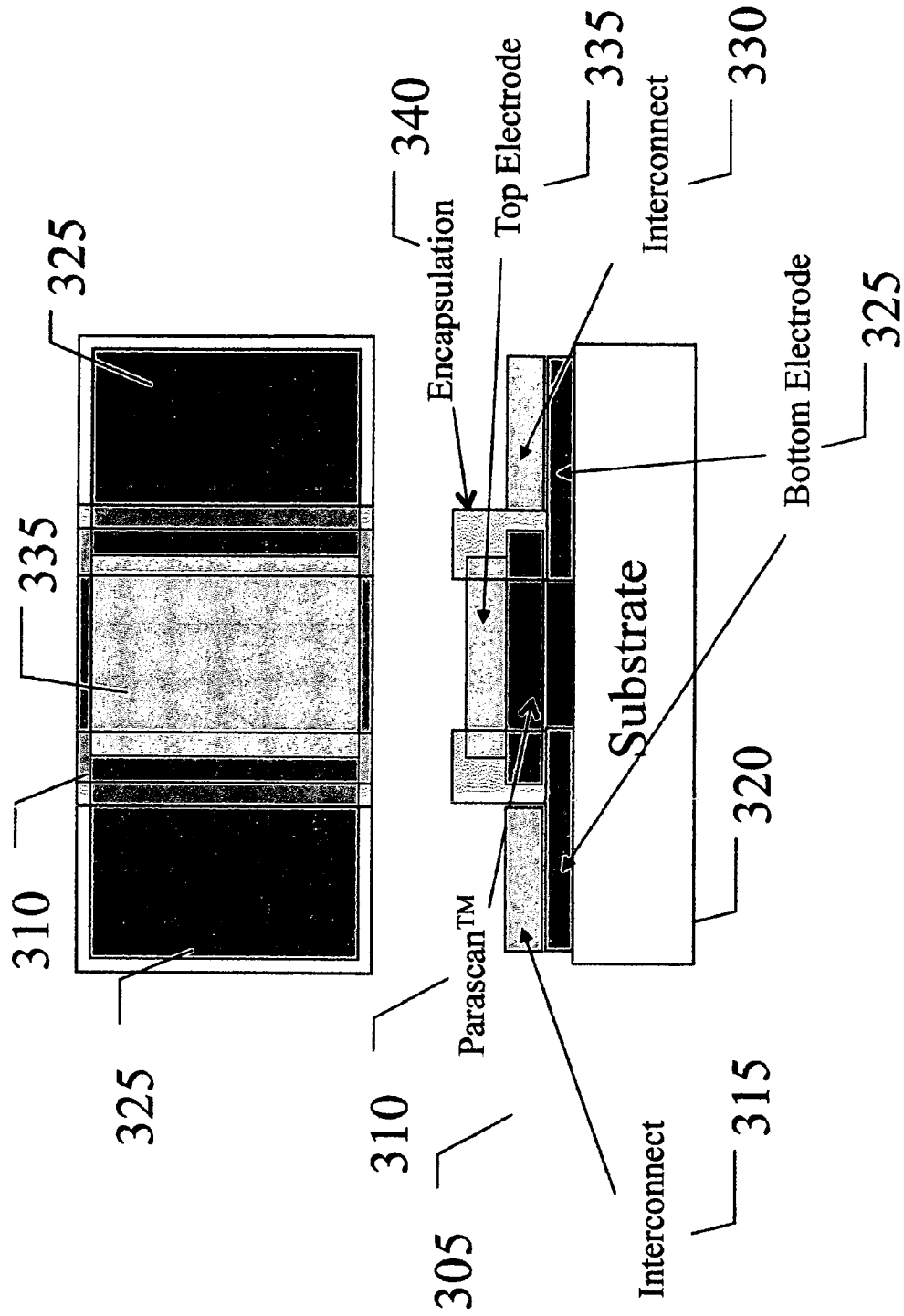
FIG. 3 is a cross sectional and top view of another embodiment of a double varactor design using optional construction of one embodiment of the present invention.

Turning now to FIG. 3, shown generally at 300 in a top view and 305 as a cross sectional view, is an embodiment of the present invention wherein a varactor comprises a substrate 320; a plurality of bottom electrodes 325 positioned on a surface of the substrate 320 separated to form a gap therein. Tunable dielectric material 310 may be positioned on the surface of the substrate 320 and within the gap. Further, this embodiment provides that the tunable dielectric 310 may at least partially overlay the plurality of bottom electrodes 325. A top electrode 335 may be in contact with the tunable dielectric 310 and a plurality of interconnects 315 and 330 may be on a surface of the plurality of electrodes 325 enabling a connection to a voltage source.

Although not limited in this respect, an embodiment of the present invention may provide that the top electrode, the tunable dielectric and the bottom electrode be encapsulated. Further, the top or bottom electrode may comprise one of: gold, aluminum, copper, nickel, palladium, platinum, platinum-rhodium, and ruthenium oxide, indium tin oxide.

Figure 4:
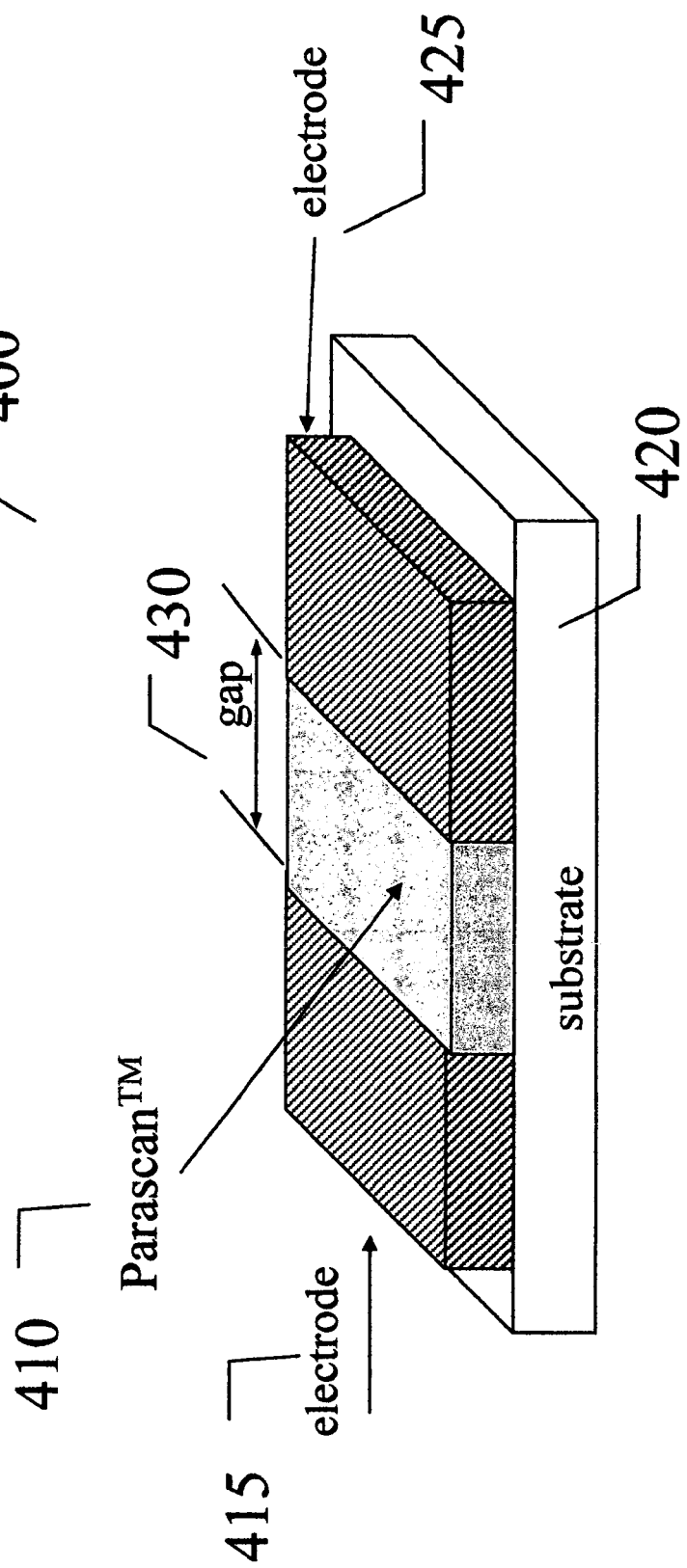
FIG. 4 is another embodiment of a vertical varactor of the present invention.

Turning now to FIG. 4, as depicted generally at 400, is a varactor comprising a substrate 420 and a first electrode 415 positioned on a surface of the substrate 420 and a second electrode 425 positioned on the surface of the substrate forming a gap 430 between the first 415 and second 425 electrodes. A tunable dielectric material 410, such as Parascan®, is positioned on the surface of the substrate 420 and within the gap. Although not limited in this respect, an embodiment of the present invention may provide that the varactor 400 may be encapsulated with a dielectric layer as shown in more detail in FIG. 5. The electrodes in this embodiment of the present invention are capable of being multi-layered with multiple metals. The multi-layered metals may be the same metals per layer or different. Further, the structure of FIG. 4 enables the electrodes to be different sizes and permits the use of small electrodes.

As mentioned above, the tunable dielectric layer may comprises one of: barium strontium titanate, barium calcium titanate, lead zirconium titanate, lead lanthanum zirconium titanate, lead titanate, barium calcium zirconium titanate, sodium nitrate, $KNbO_3$, $LiNbO_3$, $LiTaO_3$, $PbNb_2O_6$, $PbTa_2O_6$, $KSr(NbO_3)$, $NaBa_2(NbO_3)_5$, $KH_2PO_4$, and composites thereof; or the tunable dielectric layer may comprise a barium strontium titanate (BSTO) composite selected from the group of: BSTO—MgO, BSTO—$MgAl_2O_4$, BSTO—$CaTiO_3$, BSTO—$MgTiO_3$, BSTO—$MgSrZrTiO_6$, and combinations thereof.

Also, the substrate may comprise one of: MgO, alumina ($AL_2O_3$), $LaAlO_3$, glass, sapphire, quartz, silicon, gallium arsenide and any material classified as low temperature co-fired ceramic (LTCC) and the first or second electrode may comprise one of: gold, aluminum, copper, nickel, palladium, platinum, platinum-rhodium, ruthenium oxide and indium tin oxide.

Figure 5:
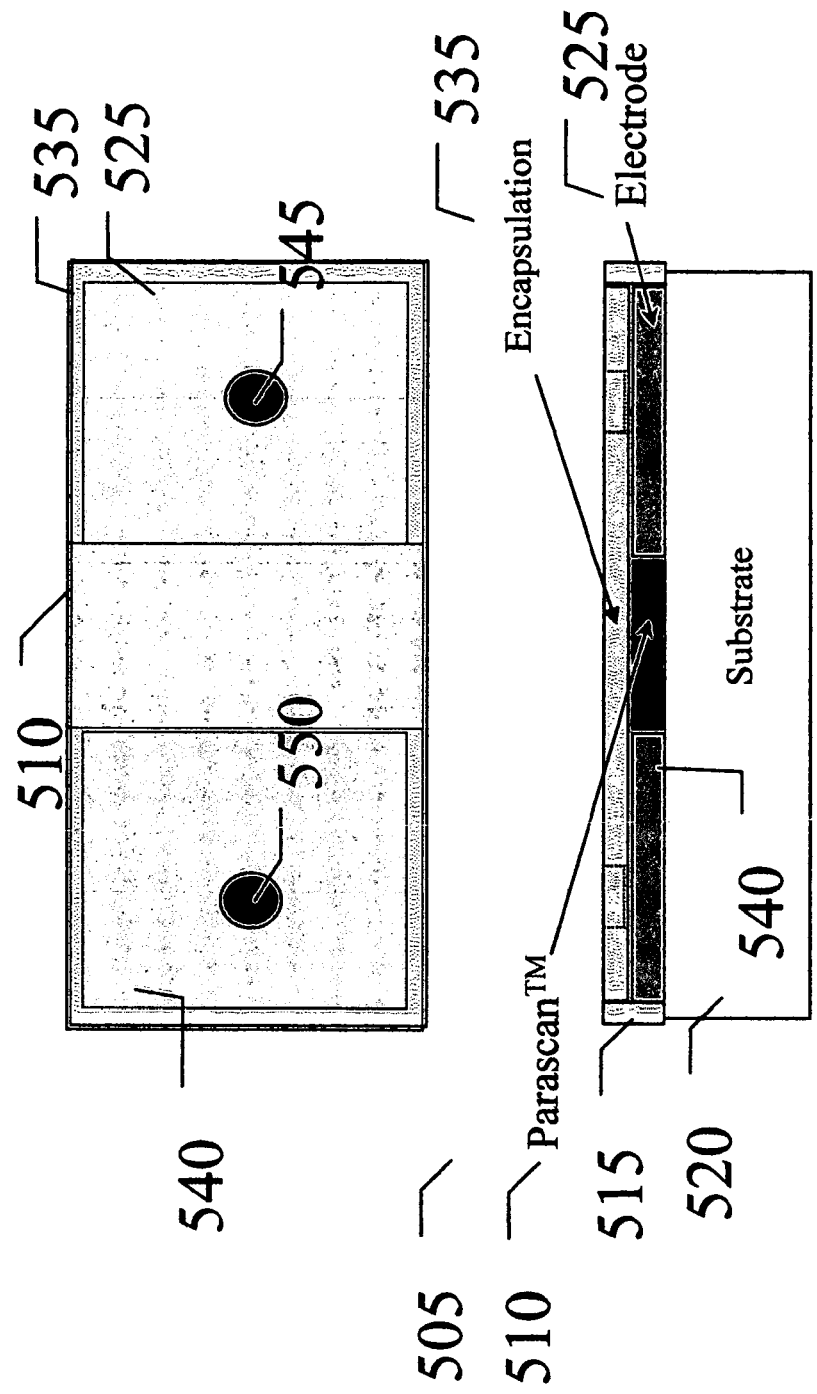
FIG. 5 is a cross sectional and top view of the vertical varactor of FIG. 4 encapsulated and with voltage source contacts.

FIG. 5 more clearly depicts, with a top view at 500 and cross sectional view at 505, the encapsulation of the varactor of FIG. 4 with substrate 520, electrodes 525 and 540, tunable dielectric 510 being at least partially encapsulated 535. Further, the contact points 545 and 550 may be connected to a voltage source via an interconnect through the encapsulation material. This arrangement eases fabrication and may provide two or more capacitors.

Figure 6:
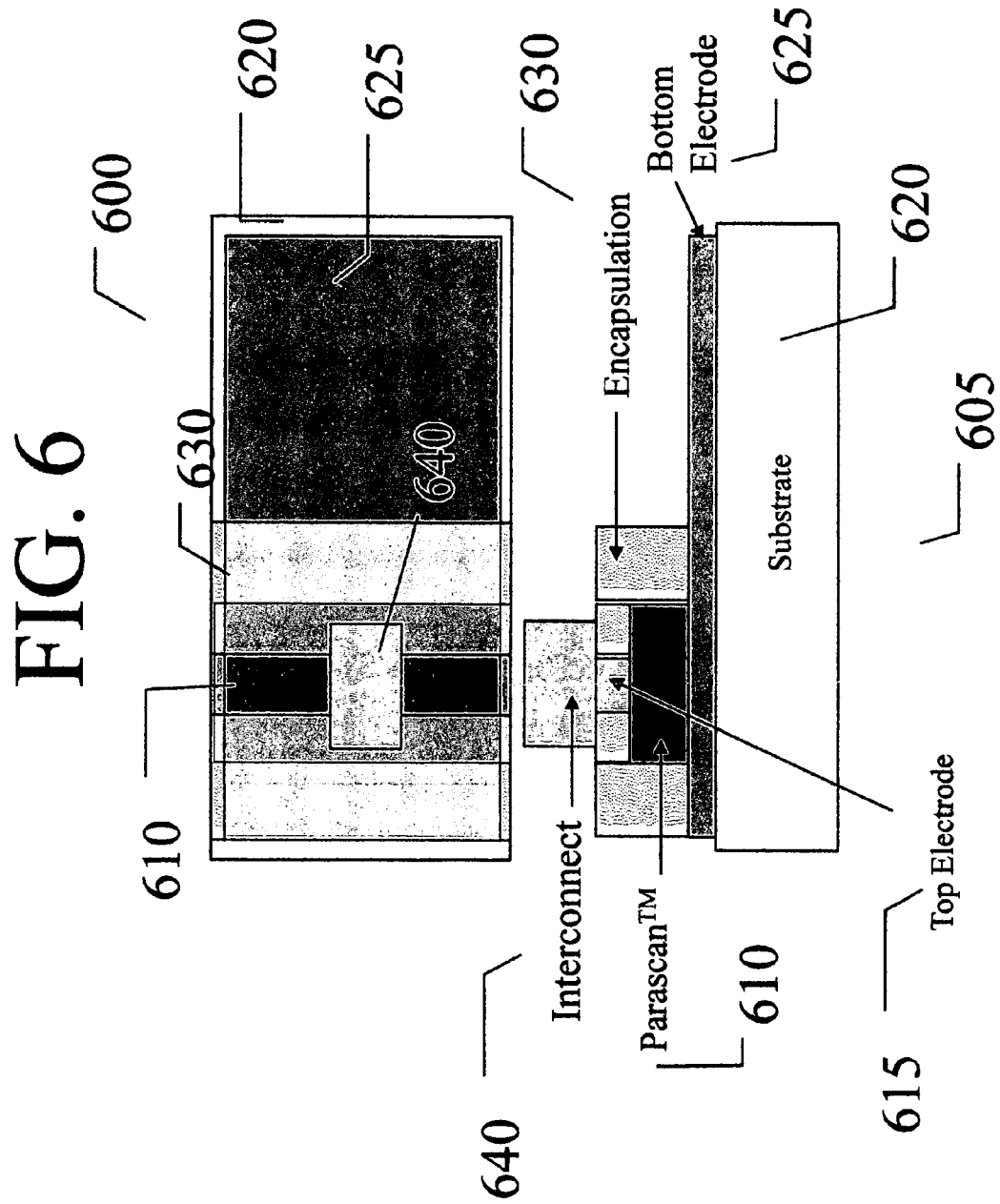
FIG. 6 is a cross sectional and top view of another embodiment of a vertical varactor with an interconnect providing voltage source connection capability.

Turning now to FIG. 6 is shown a top view 600 and cross sectional view 605 of an embodiment of the present invention of a varactor, comprising a bottom electrode 625 supported by a substrate 620. The bottom electrode 625 of this embodiment of the present invention may be in an interdigitated form. A tunable dielectric 610, such as, but not limited to, Parascan®, may be in contact with the bottom electrode 625 and in contact with a top electrode 615. The top electrode 615 may also be in contact with an interconnect 640 and capable of being in contact with a voltage source. This arrangement may facilitate the voltage source contact by the varactor while maintaining the desired width of the gap, desired top electrode size and desired thickness of tunable dielectric. The gap thickness may be placed close enough to create the desired tuning.

Further, in an embodiment of the present invention, but not limited in this respect, the top electrode 615 and the tunable dielectric 610 may be encapsulated. Again, and not limited in this respect, the tunable dielectric layer may comprises one of: barium strontium titanate, barium calcium titanate, lead zirconium titanate, lead lanthanum zirconium titanate, lead titanate, barium calcium zirconium titanate, sodium nitrate, $KNbO_3$, $LiNbO_3$, $LiTaO_3$, $PbNb_2O_6$, $PbTa_2O_6$, $KSr(NbO_3)$, $NaBa_2(NbO_3)_5$, $KH_2PO_4$, and composites thereof or the tunable dielectric layer may comprise a barium strontium titanate (BSTO) composite selected from the group of: BSTO—MgO, BSTO—$MgAl_2O_4$, BSTO—$CaTiO_3$, BSTO—$MgTiO_3$, BSTO—$MgSrZrTiO_6$, and combinations thereof. Further, the substrate 620 may comprise one of: MgO, alumina ($AL_2O_3$), $LaAlO_3$, glass, sapphire, quartz, silicon, gallium arsenide and any material classified as low temperature co-fired ceramic (LTCC) and the top 615 or bottom 625 electrode may comprise one of: gold, aluminum, copper, nickel, palladium, platinum, platinum-rhodium, and ruthenium oxide, indium tin oxide.

Figure 7:
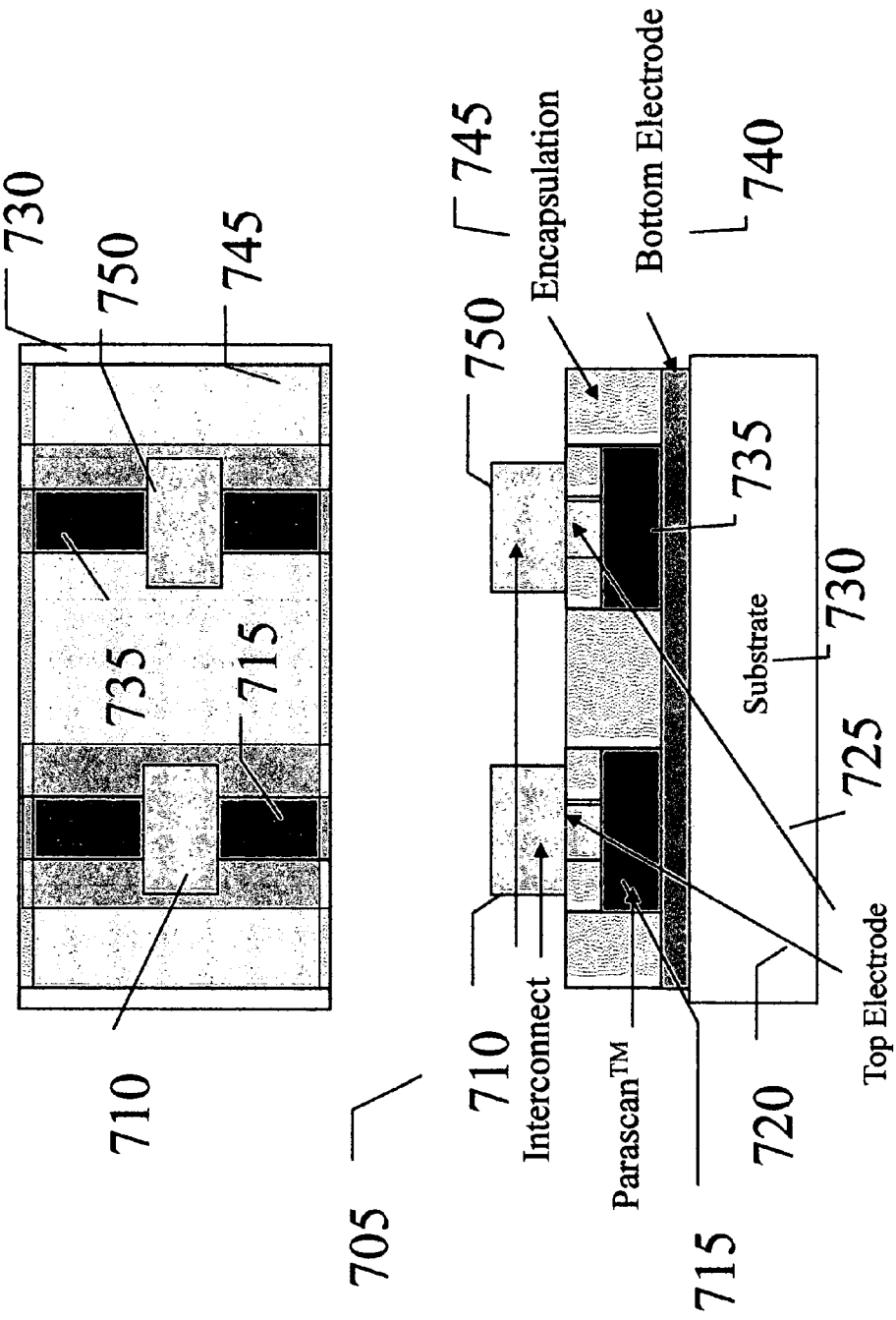
FIG. 7 is a cross sectional and top view of a vertical varactor of one embodiment of the present invention with a plurality of capacitors.

Turning now to FIG. 7, shown as a top view at 700 and cross section view at 705 is an embodiment of the present invention wherein a varactor 705 may comprise: a bottom electrode 740 supported by a substrate 730 and a first tunable dielectric 715 may be in contact with the bottom electrode 740 and in contact with a first top electrode 720. A second tunable dielectric 735 may be in contact with the bottom electrode 740 and in contact with a second top electrode 725. A first interconnect 710 may be in contact with the first top electrode 720 and a second interconnect 750 may be in contact with the second top electrode 725, the first and second interconnects 710 and 750 may be capable of being in contact with a voltage source.

An embodiment of the present invention, although not limited in this respect provides that the first 720 and second 725 top electrodes and said first 715 and second 735 tunable dielectrics may be encapsulated. Further, in an embodiment of the present invention, the top 720 and 725 or bottom 740 electrodes may comprise one of: gold, aluminum, copper, nickel, palladium, platinum, platinum-rhodium, ruthenium oxide and indium tin oxide.

Figure 8:
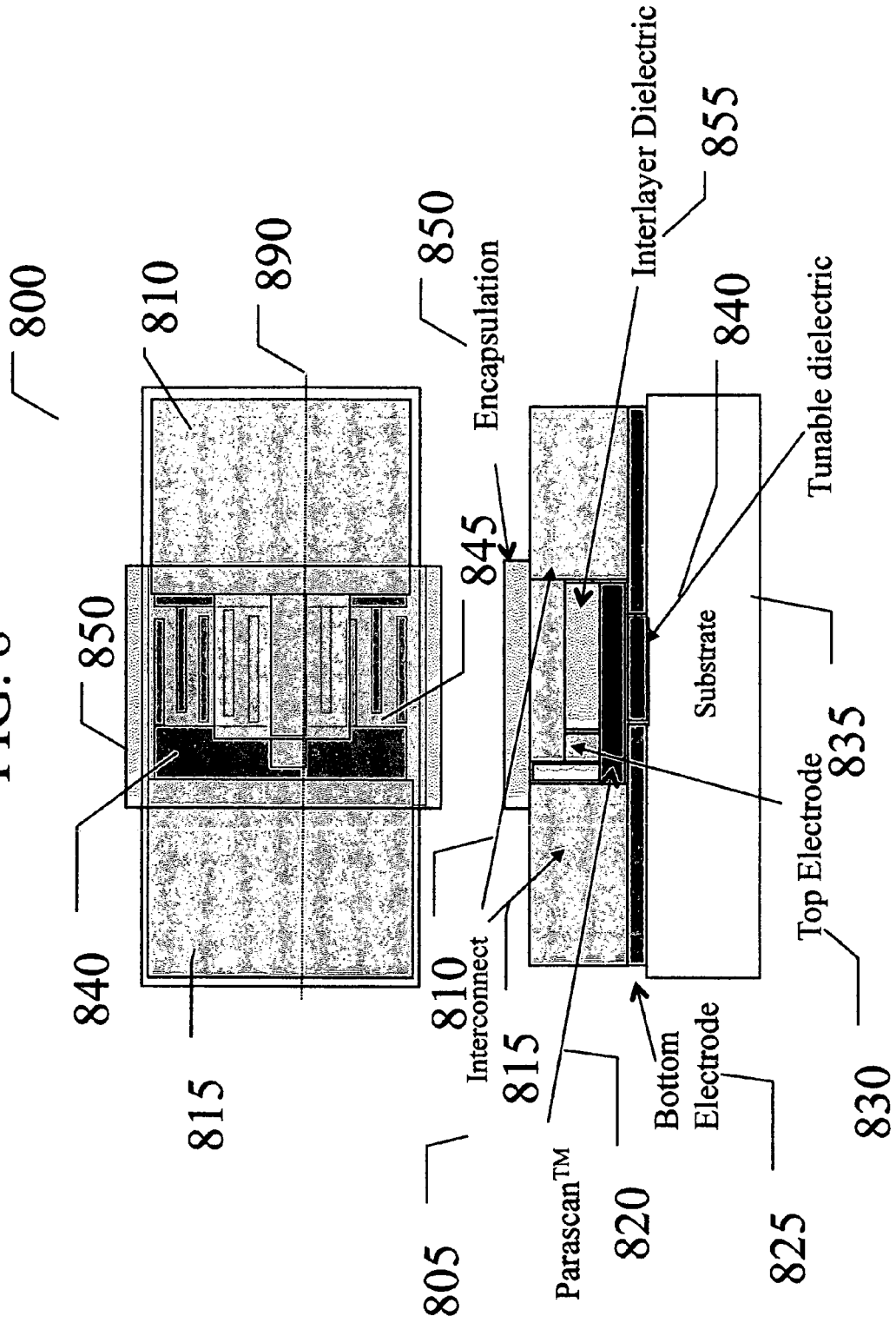
FIG. 8 is a cross sectional and top view of a vertical hybrid structure varactor of one embodiment of the present invention.

Turning now to FIG. 8, shown as a top view at 800 and cross section (through dotted line 890) view at 805 is an embodiment of the present invention wherein is provided a varactor comprising a substrate 835 and a plurality of bottom electrodes 825 positioned on a surface of the substrate 835 separated to form a gap therein. A tunable dielectric material 840 may be positioned on the surface of the substrate 835 and within the gap, the tunable dielectric 840 may partially overlay the plurality of bottom electrodes 825 and the top electrode 830 may be in contact with the tunable dielectric 840. Interconnect layers 810 and 815 may be in contact with at least a portion one of the plurality of bottom electrodes 825 and portion of the top electrode 830, and a portion of the tunable dielectric 840.

In an embodiment of the present invention and not limited in this respect the varactor may further comprise an interlayer dielectric 855 capable of being in contact with the tunable dielectric 840. Further, in an embodiment of the present invention, at least a portion of the top electrode 830, the tunable dielectric 840, the interlayer dielectric 855 and the interconnects 810 and 815 are capable of being encapsulated as shown at 850. The top or bottom electrode may comprise one of: gold, aluminum, copper, nickel, palladium, platinum, platinum-rhodium, and ruthenium oxide, indium tin oxide.

Figure 9:
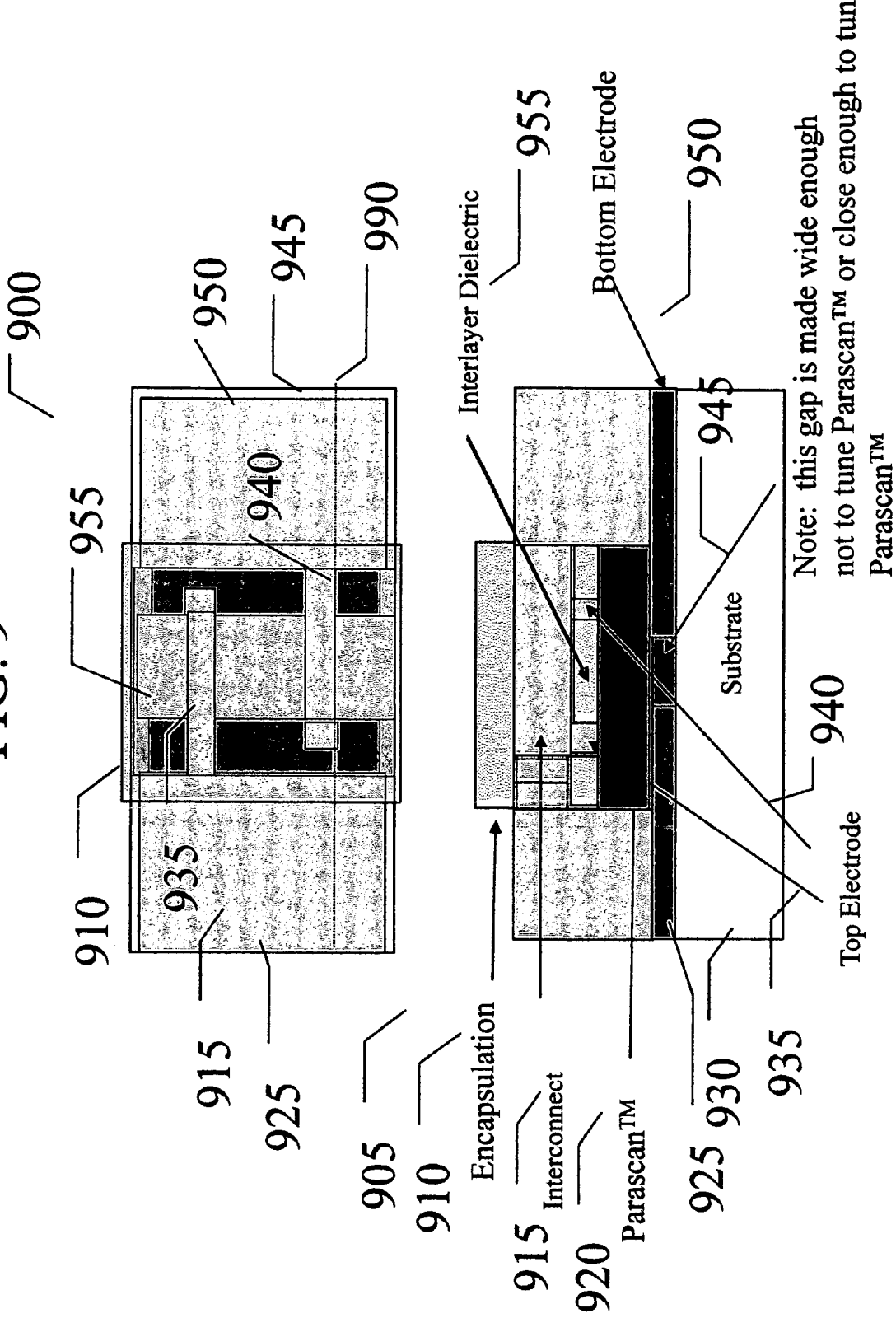
FIG. 9 is a cross sectional and top view of a mirror image vertical structure vertical varactor in accordance with one embodiment of the present invention.

Turning now to FIG. 9 another embodiment of the present invention provides, as shown in a top view at 900 and cross section view at 905 (through dotted line 990), a varactor comprising a substrate 930; a plurality of bottom electrodes 925 and 950 positioned on a surface of the substrate 930 separated to form a gap therebetween. A tunable dielectric material 945 may be positioned on the surface of the substrate 930 and within the gap, the tunable dielectric 945 may partially overlay the plurality of electrodes 925 and 950 and a plurality of top electrodes 935 and 940 may be in contact with the tunable dielectric 945. Interconnect layer 915 may be in contact with at least a portion one of the plurality of bottom electrodes 925 and 950 and portion of the plurality of top electrodes 935 and 940, and a portion of the tunable dielectric 945. In an embodiment of the present invention and not limited in this respect, the plurality of top electrodes 935 and 940 may be between a plurality of interlayer dielectric 955 and at least a portion of the plurality of top electrodes 935 and 940, said tunable dielectric 945, the plurality of interlayer dielectric 955 and the interconnect 915 are capable of being encapsulated.

Although not limited in this respect, the top 935 and 940 or bottom 925 and 950 electrodes may comprise one of: gold, aluminum, copper, nickel, palladium, platinum, platinum-rhodium, and ruthenium oxide, indium tin oxide.

Figure 10:
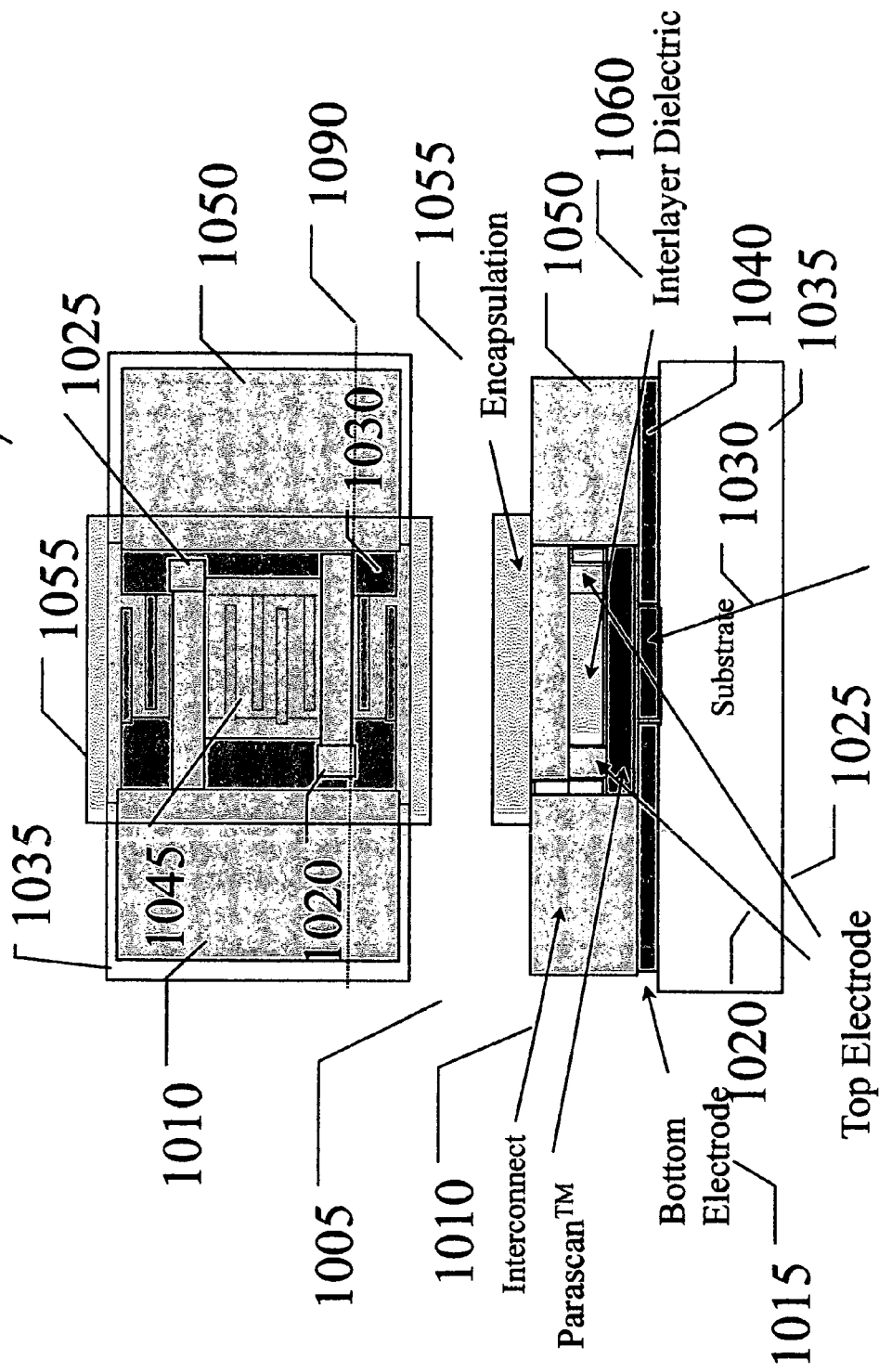
FIG. 10 is a cross sectional and top view of another embodiment of a varactor of the present invention.

Turning now to FIG. 10 another embodiment of the present invention provides, as shown in a top view at 1000 and cross section view at 1005 (crossed at dotted line 1090), a varactor comprising a substrate 1035; a plurality of bottom electrodes 1015 and 1040 positioned on a surface of the substrate 1035 separated to form a gap between the plurality of bottom electrodes 1015 and 1040. A tunable dielectric material 1030 positioned on the surface of the substrate 1035 and within the gap may partially overlay the plurality of bottom electrodes 1015 and 1040 and a plurality of top electrodes 1020 and 1025 may be in contact with the tunable dielectric 130. An interconnect layer 1010 and 1050 may be in contact with at least a portion one of the plurality of bottom electrodes 1015 and 1040 and portion of the plurality of top electrode 1020 and 1025, and a portion of the tunable dielectric 1030.

In one embodiment of the present invention and not limited in this respect, the plurality of top electrodes 1020 and 1025 may be separated by an interlayer dielectric and at least a portion of the plurality of top electrodes 1020 and 1025, the tunable dielectric 1030, the plurality of interlayer dielectrics 1060 and the interconnect 1010 and 1050 are capable of being encapsulated as depicted at 1055.

FIG. 11 as shown as a top view at 1100 and cross section view at 1105 provides a varactor comprising a substrate 1125, a bottom electrode 1145 positioned on a surface of the substrate 1125; a first tunable dielectric portion 1120 in contact with a first side of the bottom electrode 1145 and a portion of the substrate 1125; a second tunable dielectric portion 1150 in contact with a second side of the bottom electrode 1145 and a portion of the substrate 1125; a first interconnect 1110 in contact with a first side of the tunable dielectric 1120 and in contact with a first top electrode 1130 and a portion of the substrate 1125; and a second interconnect 1110 in contact with a second side of the tunable dielectric 1150 and in contact with a second top electrode 1155 and a portion of the substrate 1125. Although not limited in this respect the first and second top electrodes 1130 and 1155 form a gap there between and are capable of connecting to a voltage source. Further, again not limited in this respect, at least a portion of the varactor may be encapsulated 1140 and the first or second top 1130 and 1155 or bottom electrodes 1145 may comprise one of: gold, aluminum, copper, nickel, palladium, platinum, platinum-rhodium, and ruthenium oxide, indium tin oxide.

In yet another embodiment of the present invention, a varactor may comprise at least one bottom electrode supported by a substrate; at least one top electrode with a tunable dielectric separating the at least one bottom and at least one top electrode; and an interconnect layer in contact with at least a portion one of at least one bottom electrode and portion of the at least one top electrode, and a portion of the tunable dielectric. Further, an interlayer dielectric may be in contact with any or all of the at least one bottom electrode, the at least one top electrode and the tunable dielectric and any or all of the at least one bottom electrode, the at least one top electrode and the tunable dielectric may be encapsulated. Although the present invention is not limited in this respect.

In another embodiment of the present invention is provided a method of manufacturing a varactor, comprising: providing a substrate; positioning a bottom electrode on a surface of the substrate; placing a tunable dielectric material adjacent to and extending over the bottom electrode forming a step and in contact with a top electrode; placing an interconnect layer in contact with the bottom electrode, the tunable dielectric and the top electrode. The method may further comprise encapsulating any or all of the bottom electrode, the tunable dielectric, the top electrode, the bottom electrode or the interlayer dielectric. The method may also further comprise placing an interlayer dielectric in contact with the top electrode, the tunable dielectric and the interlayer dielectric and the top or bottom electrode may comprise one of: gold, aluminum, copper, nickel, palladium, platinum, platinum-rhodium, and ruthenium oxide, indium tin oxide.

Another method of manufacturing a varactor, may comprise: providing a substrate; positioning a plurality of bottom electrodes on a surface of the substrate separated to form a gap therein; positioning a tunable dielectric material on the surface of the substrate and within the gap, the tunable dielectric at least partially overlaying the plurality of electrodes; and placing a top electrode in contact with the tunable dielectric. This embodiment may further comprise encapsulating the top electrode, the tunable dielectric and the bottom electrode.

While the present invention has been described in terms of what are at present believed to be its preferred embodiments, those skilled in the art will recognize that various modifications to the disclose embodiments can be made without departing from the scope of the invention as defined by the following claims.

What is claimed is:

1. A device, comprising:
  a bottom electrode;
  a tunable dielectric in contact with the bottom electrode and in contact with first and second top electrodes;
  an encapsulation layer positioned in a gap between the first and second top electrodes;
  a first interconnect in contact with the first top electrode; and
  a second interconnect in contact with the second top electrode, wherein the first and second interconnects are connectable with a voltage source so that the device provides first and second capacitors in series, and wherein the encapsulation layer is formed over top surfaces of each of the first and second interconnects.

2. The device of claim 1, wherein the first top electrode, the second top electrode or the bottom electrode comprises one of: gold, aluminum, copper, nickel, palladium, platinum, platinum-rhodium, ruthenium oxide, or indium tin oxide.

3. The device of claim 1, wherein the tunable dielectric includes material selected from the group comprising barium strontium titanate, barium calcium titanate, lead zirconium titanate, lead lanthanum zirconium titanate, lead titanate, barium calcium zirconium titanate, sodium nitrate, $KNbO_3$, $LiNbO_3$, $LiTaO_3$, $PbNb_2O_6$, $PbTa_2O_6$, $KSr(NbO_3)$, $NaBa_2(NbO_3)_5$, $KH_2PO_4$, or composites thereof.

4. The device of claim 1, wherein the tunable dielectric includes a barium strontium titanate (BSTO) composite selected from the group comprising BSTO—MgO, BSTO—$MgAl_2O_4$, BSTO—$CaTiO_3$, BSTO—$MgTiO_3$, BSTO—$MgSrZrTiO_6$, or combinations thereof.

5. The device of claim 1, further comprising a substrate that supports the bottom electrode, wherein the substrate includes a material selected from the group comprising MgO, Alumina ($Al_2O_3$), $LaAlO_3$, glass, sapphire, quartz, silicon, gallium arsenide or a low temperature co-fired ceramic (LTCC).

6. The device of claim 1, wherein the device is symmetrical.

7. A device, comprising:
  a bottom electrode;
  a tunable dielectric in contact with the bottom electrode and in contact with first and second top electrodes;
  an encapsulation layer positioned in a gap between the first and second top electrodes;
  a first interconnect in contact with the first top electrode;
  a second interconnect in contact with the second top electrode, wherein the first and second interconnects are connectable with a voltage source so that the device provides first and second capacitors in series, and wherein the encapsulation layer is formed over top surfaces of each of the first and second interconnects; and
  an adhesion layer positioned between the bottom electrode and the tunable dielectric, or positioned between the tunable dielectric and the first and second top electrodes.

8. The device of claim 7, wherein the tunable dielectric includes material selected from the group comprising barium strontium titanate, barium calcium titanate, lead zirconium titanate, lead lanthanum zirconium titanate, lead titanate, barium calcium zirconium titanate, sodium nitrate, $KNbO_3$, $LiNbO_3$, $LiTaO_3$, $PbNb_2O_6$, $PbTa_2O_6$, $KSr(NbO_3)$, $NaBa_2(NbO_3)_5$, $KH_2PO_4$, or composites thereof.

9. The device of claim 7, wherein the tunable dielectric includes a barium strontium titanate (BSTO) composite selected from the group comprising BSTO—MgO, BSTO—

$MgAl_2O_4$, BSTO—$CaTiO_3$, BSTO—$MgTiO_3$, BSTO—Mg-$SrZrTiO_6$, or combinations thereof.

* * * * *